United States Patent [19]
Offord

[11] Patent Number: 5,513,141
[45] Date of Patent: Apr. 30, 1996

[54] SINGLE PORT REGISTER

[75] Inventor: Glen E. Offord, Macungie, Pa.

[73] Assignee: AT&T Corp., Murray Hill, N.J.

[21] Appl. No.: 383,161

[22] Filed: Feb. 3, 1995

[51] Int. Cl.$^6$ .................................................. G11C 7/00
[52] U.S. Cl. ............................... 365/189.05; 365/230.08
[58] Field of Search ....................... 365/189.05, 189.12, 365/230.08, 240

[56] References Cited

U.S. PATENT DOCUMENTS 5,361,229 11/1994 Chiang et al. ...................... 365/189.05
5,388,074 2/1995 Buckenmaier ...................... 365/189.05

*Primary Examiner*—Tan T. Nguyen
*Attorney, Agent, or Firm*—James H. Fox

[57] ABSTRACT

A novel mad/write control register uses the same bus port for reading and writing, while requiting only one unique control line. The technique may be implemented as a "D" type level sense latch. The write operation is similar to standard latch operation: the transmission gate on the D input is turned on while the feedback transmission gate is off. However, for read operation, both transmission gates are enabled, thereby allowing the register output value to drive the bus. A preset or clear capability may optionally be provided. This approach reduces the size of the register as compared to standard read/write registers, and requires only one unique control line versus two, thus reducing decoding logic and routing. Since only one port to the bus is required, the bus load gate capacitance is typically one-half that of the standard approach.

5 Claims, 2 Drawing Sheets

SIZED LATCH WITH INDEPENDENTLY CONTROLLED TRANSMISSION GATES (33,34)

| | FUNCTION | SWITCHES 34 | 33 |
|---|---|---|---|
| ADDRESS VALID | WRITE | ON | OFF |
| | READ | ON | ON |
| ADDRESS INVALID | HOLD | OFF | ON |

SIZED LATCH WITH INDEPENDENTLY CONTROLLED TRANSMISSION GATES (33,34)

|  |  | SWITCHES | |
|---|---|---|---|
| FUNCTION |  | 34 | 33 |
| ADDRESS VALID | WRITE | ON | OFF |
|  | READ | ON | ON |
| ADDRESS INVALID | HOLD | OFF | ON |

2

SINGLE PORT REGISTER

BACKGROUND OF THE INVENTION

1. Field of the Invention

The present invention relates to a integrated circuit single port register.

2. Description of the Prior Art

The use of read/write control registers is common in the integrated circuit art. Referring to an illustrative case shown in FIG. 1, a D flip-flop 100 represents one of a bank of N flip-flops being accessed at a given time. The flip-flop 100 serves as the register latch for holding the desired register value and providing it to output node 106. In order to write data into the latch, a WRITE signal is asserted on line 108. This signal is typically supplied to a plurality of control logic gates similar to the illustrated gate 102, and hence may be referred to as a "generic" WRITE signal. In addition, an ADDRESS signal is asserted on line 109 for the particular register bank selected, and hence this signal is referred to as a "unique" ADDRESS. The logical combination of these signals is supplied from AND gate 102 via line 111 to the clock input of flip-flop 100. Therefore, the data input present on a given conductor of read/write data bus 107 (either logic "0" or alternatively logic "1") is latched into the flip-flop 100 at the fall (high-to-low transition) of the WRITE signal from 102. The latched signal value is supplied via the Q output as the register value to other circuitry (not shown).

In many cases, it is desired to read out the value of the register from the same data bus that supplied the data to the register. This is useful, for example, in performing diagnostic testing of the logic circuitry. Therefore, a read output may be obtained by the inclusion of tri-state buffer 101, being a representative one of a bank of N buffers that supplies the signal from representative output node 106 to a read data bus 105. This read data bus is connected to the write data bus 104 to form a read/write data bus 107. Note that the read data bus is often buffered by means of a read buffer (not shown) before being combined with the write data bus. Similarly, the write data bus is often buffered by means of a write buffer (not shown) before it reaches the D input. These buffers are activated by control lines (also not shown) as appropriate during read and write operation. Note that the tri-state output buffer 101 is controlled by line 112 from AND gate 103, which activates the buffer 101 when both an address unique to the register is supplied on line 109, and a generic read signal is supplied on line 110.

SUMMARY OF THE INVENTION

I have invented a single-port register of simplified design, wherein both input signals and output signals are provided on the same read/write data line by means of a latch having an internal feedback path comprising an input switch and a feedback switch. In the inventive technique, both the input switch and the feedback switch are turned on when it is desired to read the latch output signal from the read/write data line.

DETAILED DESCRIPTION

Figure 1:
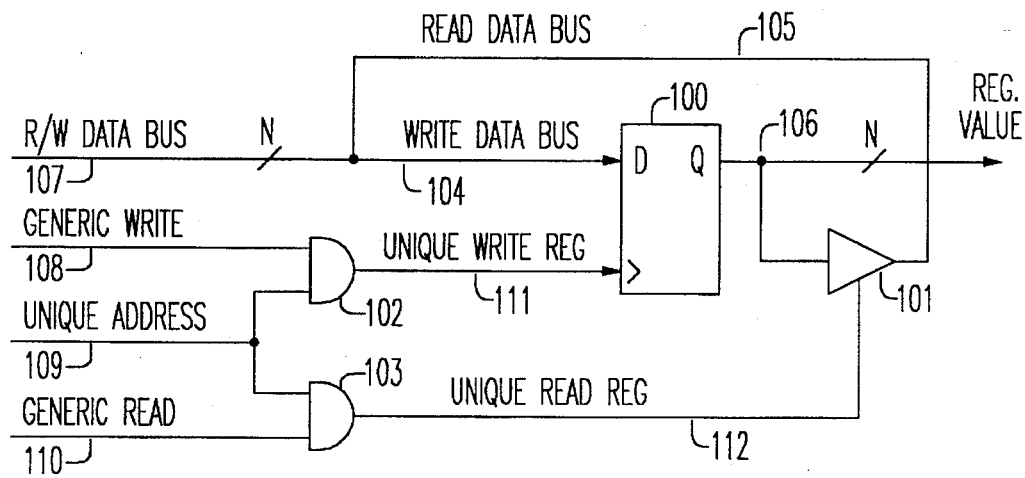
FIG. 1 shows a prior-art read/write register.
Figure 2:
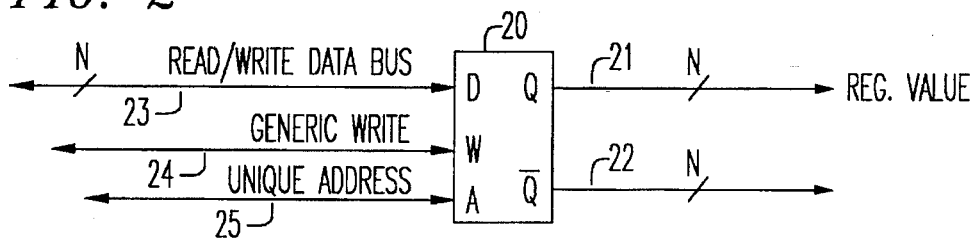
FIG. 2 shows an embodiment of the inventive register.

The following detailed description relates to a single port register of improved design. Referring to FIG. 2, a representation of the inventive technique shows how the register may be viewed as a latch 20 having a read/write data bus 23, a genetic write line 24, and a unique address line 25. In addition, it provides a Q output on line 21, and a Q output on line 22. However, note that the inventive register does not require the tri-state latch 101 or the separate read data bus 105 shown in FIG. 1. Furthermore, it does not require the control circuitry 102 and 103. This is because the read output of the latch is provided over the same line 23 (FIG. 2) as the write input into the latch, in a manner more fully described below. The data bus 23 and outputs 21 and 22 are each shown as single conductors of a bus having N conductors, although only a single latch is shown for simplicity. However, in practice, a group of N latches is used to implement a register, where N is typically 4, 6, 8, 16, 32, or 64, but may be any desired value. The number of latches in a given register is typically equal to the number of bus conductors, but may differ in some cases.

Figure 3:
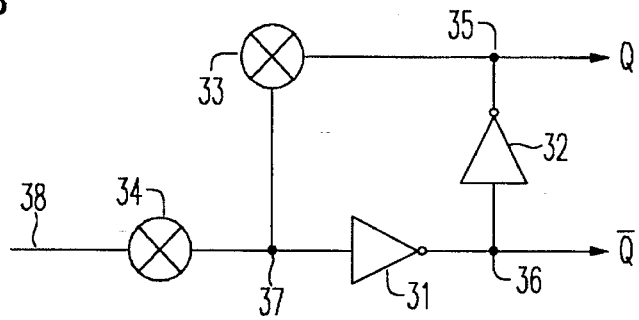
FIGS. 3 to 5 show in more detail a typical embodiment of the inventive register.

Referring to FIG. 3, a description of the latch and it operation is provided. The latch includes inverters 31 and 32, a feedback switch 33 and an input switch 34. The switches are typically implemented as transmission gates in MOS technology. This arrangement is conventional as thus far described for a typical prior-an D latch. However, the operation of the switches provides for an improved operation, as follows: When the genetic WRITE and unique addresses are valid, a write function is implemented by turning on input switch 34 and turning off feedback switch 33. This allows the input signal on line 38 to set the state of the latch by means of inverters 31 and 32, so that the Q output is high if the input signal on line 38 is high, and the Q output is low if the input signal on line 38 is low. When the generic WRITE and unique addresses are invalid, the latch is placed in a "hold" state by turning input switch 34 off and turning feedback switch 33 on. This provides that the Q output is fed back to the input of inverter 31, thereby causing inverters 31 and 32 to hold the present state. As thus far described, this operation of the switches 33 and 34 is comparable to prior-an techniques. However, in addition, the present invention provides for a feedback path from the Q output to the line 38 when it is desired to read the output data onto the line 38. This is accomplished by turning on both switches 33 and 34, thereby conducting the voltage on output node 35 to input node 37, and thence to line 38.

Figure 4:
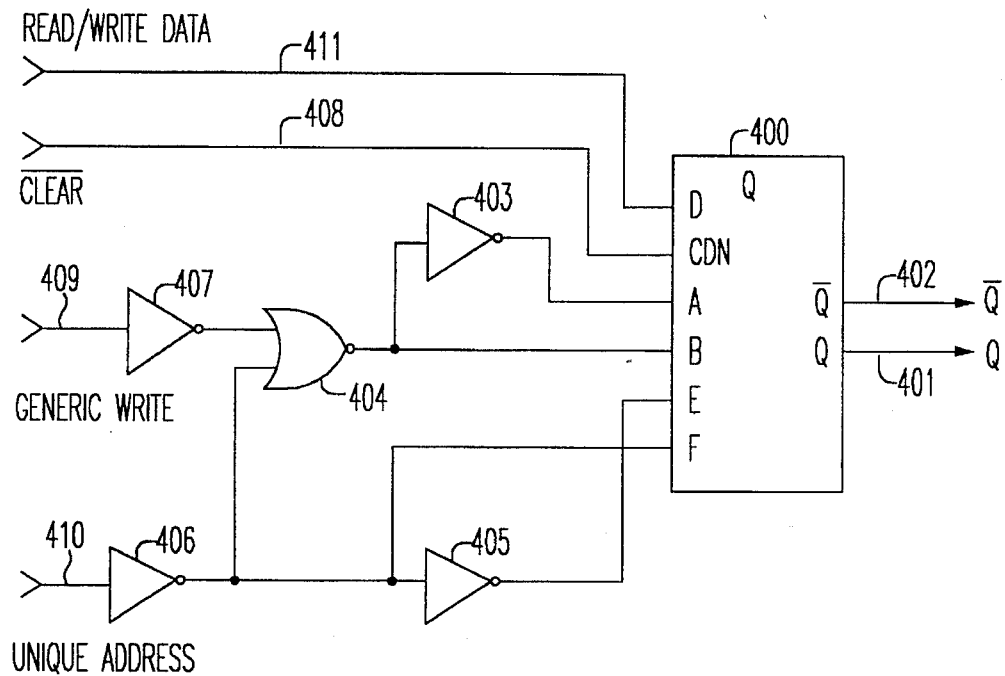

Referring to FIG. 4, a more detailed view of the register is shown, with the block 400 representing a given D latch and the gates 403–407 implementing the control circuitry. Note that the latch and control circuitry shown in FIG. 4 is comparable to the block 20 shown in FIG. 2. The read/write data line 411 is supplied to a "D" input of the latch, whereas an optional $\overline{\text{CLEAR}}$ signal is provided via line 408 to a "CDN" input The generic WRITE signal is supplied via line 409 to inverter 407 to NOR gate 404, wherein it is combined with a unique ADDRESS signal from line 410 and inverter 406. The output of the NOR gate 404 is supplied to a "B" input of latch 400, and an inverted output signal is supplied via inverter 403 to an "A" input. Finally., the unique ADDRESS signal is supplied from line 410 through inverter 406 to an "F" input, and through a second inverter 405 to an "E" input. The Q output of the latch 400 is supplied via line 401, and the $\overline{\text{Q}}$ output is supplied via line 402. A typical implementation may use a generic $\overline{\text{WRITE}}$ signal in lieu of the WRITE signal, in which case inverter 407 is omitted at the input of 404. Note that the control circuitry may be implemented with other logic that implements the same Boolean logic as that illustrated. In particular, note that the WRITE and ADDRESS signals are logically "ANDed" to perform a write operation to the latch. In addition, the complement signals (e.g., $\overline{\text{WRITE}}$) may be used to implement these functions.

Figure 5:
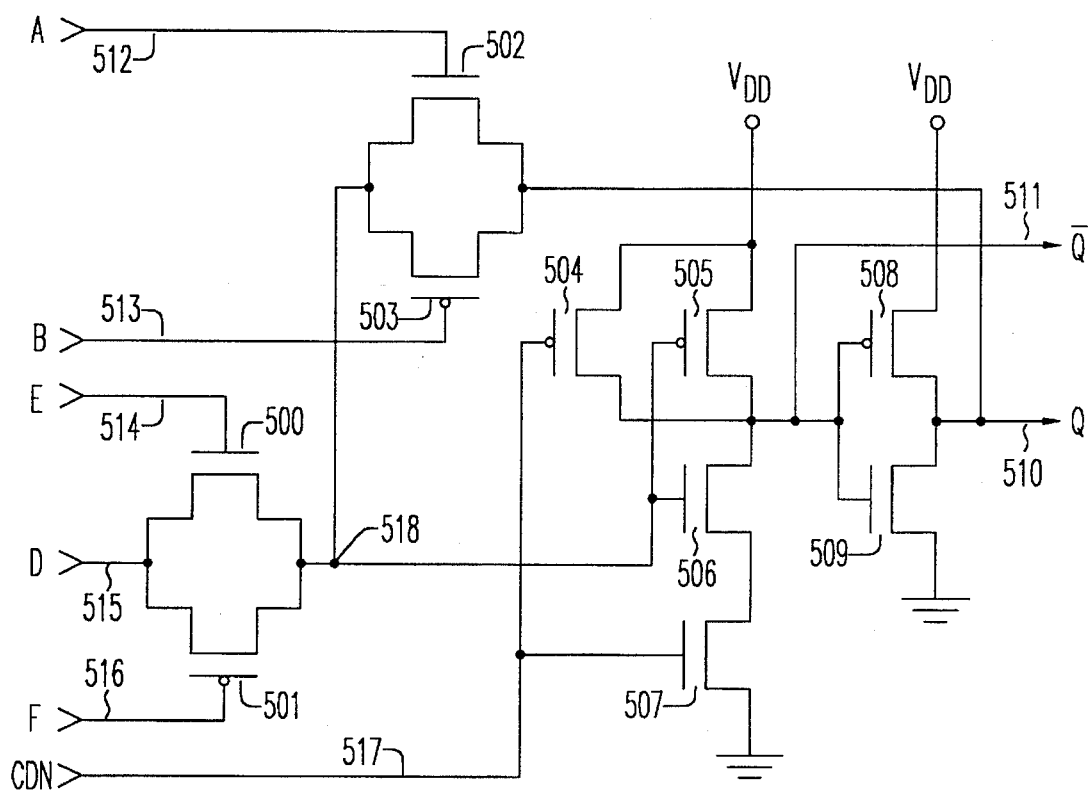

Referring to FIG. 5, a schematic of the latch 400 is shown. This latch is comparable at a schematic level to typical prior-art D type latches. However, the operational control signals supplied thereto, and also the transistor sizing, provide for the novel operation as discussed below. The "D" input is supplied on conductor 515 to complementary transmission gates 500–501, which implement the input switch (34 in FIG. 3), being controlled by the "E" input and "F" input as shown. Hence, when the "E" input voltage is high and the "F" input voltage is low, the transistors 500 and 501 conduct, so that the input switch is turned on. This corresponds to the case wherein the unique ADDRESS is asserted (high) on line 410 in FIG. 4. The input switch transistors 500, 501 have their sources connected to the gates of complementary transistors 505–506, which implement the inverter 31 shown in FIG. 3 as part of a NAND gate which also implements an optional clear function. The complementary transistors 508–509 implement a second inverter (32 in FIG. 3) that supplies the Q output via line 510 and the $\overline{Q}$ output via line 511. Note that the Q output is also supplied to transistors 502 and 503, which implement the feedback switch (33 in FIG. 3). The complementary transistors that implement the input switch and feedback switch are illustratively designated as having their sources connected to node 518, and their drains connected to nodes 515 and 510, respectively. However, the designation of source and drain of a given transistor may be reversed depending on direction of current flow, as will be apparent to persons of skill in the art.

Writing: When the unique ADDRESS is valid (e.g., line 410 in FIG. 4 is high), and the generic WRITE is also valid (line 409 in FIG. 4 is high), the A input (line 512 in FIG. 5) is low and the B input (513) is high, thereby turning off transistors 502 and 503 respectively. Furthermore, the E input (514) is high and the F input (516) is low turning on the D input transmission gate formed by transistors 500 and 501. Thus the D input (515) is connected via the D input transmission gate to 518, and the signal is inverted by the NAND gate comprising transistors 504, 505, 506 and 507, thereby providing the $\overline{Q}$ output on 511. The signal is again inverted by means of the inverter comprising transistors 508 and 509 to form the Q output on 510. When the unique ADDRESS goes invalid (as described in the previous paragraph), the latch maintains the value just written.

Reading: Reading from the latch is possible when the unique ADDRESS becomes valid (e.g., line 410 goes high), and the genetic write line is invalid (409 low). This provides that the A input (512) is high and the B input (513) is low, which turns on the transmission gate formed by transistors 502 and 503, and provides that the E input (514) is high and the F input (516) is low, turning on the transmission gate formed by the transistors 500 and 501. Therefore, both switches 33 and 34 in FIG. 3 are on, allowing the value at Q (510) to be available at the D input (515). Note that the logic value at 518 is the same as the Q output and can be read at the D input (515). The transistors in the latch desirably have a size ratio such that a read operation can not inadvertently become a write due to charge stored at the input nodes. For example, transistors 508, 509, 502 and 503 are typically relatively large compared to transistors 500 and 501, so that a charge on node 515 due to input capacitance does not inadvertently over-write the signal stored in the latch.

Referring to FIG. 3, the voltage at 37 which is driven by inverter 32 in series with transmission gate 33 is connected to the input of the latch via transmission gate 34. The impedances of the inverter 32 and the two transmission gates are chosen so that the voltage at 37 is limited in swing such that the threshold switching voltage of inverter 31 is not crossed during a read. While the actual sizing depends on the specific technology and process used, a generic CMOS example can be given: The usual worse case is when 37 is high and 38 is low with large capacitance. A read under these conditions causes the series resistance of the p-channel transistors in 32 and 33 and the n-channel transistor in 34 to form a voltage divider. Assume that the n-channel transistors have ⅓ the equivalent resistance of a similarly sized p-channel transistor, and that the switching level of inverter 31 is midway between the power supples. Therefore, if 508 and 502 (in FIG. 5) are the same size, then 500 should typically be less than 1/6 that size. The size ratio of the p-channel transistor in 34 can be as large as ⅔ of the size of the n-channel transistors in 32 or 33 in a typical case. Thus, referring again to FIG. 3, transmission gate 34 has small transistors compared to inverter 32 and transmission gate 33. This provides a low capacitance to the bus but results in longer read times since the bus must be charged/discharged through relatively small devices. The length of the transistor gates is typically the same for these devices, with the size being then determined by the gate width.

Holding: If the unique ADDRESS is not asserted, the latch holds its present value. When the unique ADDRESS is not true (e.g., line 410 in FIG. 4 is low), the A input (512) is high and the B input (513) is low, thereby turning on transistors 502 and 503 respectively, which form switch 33 in FIG. 3. For this non-addressed state, the E input (514) is low and the F input (516) is high, thereby turning off transistors 500 and 501, respectively, which form the input switch (34 in FIG. 3). Thus the Q output, 510, is connected through transistors 502 and 503 (feedback switch 33) to an input of the NAND gate formed via transistors 504, 505, 506 and 507, and inverted again via the inverter comprising transistors 508 and 509.

The optional $\overline{\text{CLEAR}}$ signal supplied to the optional "CDN" input via line 408 turns on optional transistor 504 while turning off optional transistor 507 when the voltage on line 517 goes low. This clears the register by pulling up the input on the gates of transistors 508 and 509 to $V_{DD}$, so that the Q output is set low. An optional SET signal may be provided to set the Q output high. Still other variations on the design of the latch are possible for use with the present invention.

I claim:

1. An integrated circuit having a data register that communicates with a read/write data bus, said register having a write input and an address input, and having a register output for providing a register output signal;

wherein said data register provides a signal on said data bus to said register output when a write signal is supplied to said write input and an address signal is supplied to said address input, and further provides said register output signal to said data bus when said address signal is supplied to said address input and said write signal is not supplied to said write input;

and wherein the data register holds its present value when an address signal is not supplied to said address input.

2. The invention of claim 1 wherein said data register comprises a latch having an input switch and a feedback switch, and a first inverter and a second inverter each having an input and an output, and wherein said input switch is connected between a conductor of said read/write data bus and the input of said first inverter, the output of said first inverter is coupled to the input of said second inverter, and the feedback switch is connected between the output of said second inverter and said input of said first inverter;

whereby said data bus is operatively connected to the input of said first inverter when an address signal is supplied to said address input, and said data bus is also operatively connected to the output of said second inverter when said address signal is supplied to said address input and said write signal is not supplied to said write input.

3. The invention of claim 2 wherein said input switch comprises an n-channel and a p-channel field effect transistor having their drains connected together at a switch input node, their sources connected together at a switch output node, and their gates connected to first and second control nodes, respectively; and wherein said feedback switch comprises an n-channel and a p-channel field effect transistor having their sources connected together at a switch input node, their drains connected together at a switch output node, and their gates connected to third and fourth control nodes, respectively; and wherein the first and second control nodes are coupled to receive the address signal and its complement, and the third and fourth control nodes are coupled to receive the logical "AND" combination of said address signal and said write signal, and the complement of said combination.

4. The invention of claim 3 wherein said first inverter and said second inverter each comprise an n-channel field effect transistor serially connected with a p-channel field effect transistor.

5. The invention of claim 4 wherein the size of the transistors in said second inverter, and the size of the transistors in said feedback switch, are large compared to the size of the transistors in said input switch so that stored charge at the input node of said input switch does not inadvertently change the state of the stored signal in said latch.

\* \* \* \* \*